United States Patent [19]

Masquelier et al.

[11] Patent Number: 4,966,858

[45] Date of Patent: Oct. 30, 1990

[54] METHOD OF FABRICATING A LATERAL SEMICONDUCTOR STRUCTURE INCLUDING FIELD PLATES FOR SELF-ALIGNMENT

[75] Inventors: Michael P. Masquelier, Mesa; David N. Okada, Tempe, both of Ariz.

[73] Assignee: Motorola Inc., Schaumburg, Ill.

[21] Appl. No.: 430,396

[22] Filed: Nov. 2, 1989

[51] Int. Cl.⁵ .................................... H01L 21/328
[52] U.S. Cl. .................................... 437/27; 437/32; 437/41; 437/45; 437/47; 437/50; 437/60; 437/61; 437/69; 437/150; 437/917; 437/924; 437/984; 148/DIG. 13; 148/DIG. 45; 148/DIG. 167
[58] Field of Search .................. 437/27, 28, 29, 31, 437/32, 41, 45, 47, 50, 56, 57, 58, 59, 60, 61, 69, 70, 71, 72, 73, 150, 151, 984, 924, 917; 148/DIG. 13, DIG. 45, DIG. 167; 357/23.8, 35, 53

[56] References Cited

U.S. PATENT DOCUMENTS

| | | | |
|---|---|---|---|
| 4,308,549 | 12/1981 | Yeh | 357/53 |
| 4,414,560 | 11/1983 | Lidow | 357/53 |
| 4,561,170 | 12/1985 | Doering et al. | 437/57 |
| 4,789,810 | 1/1989 | Blanchard et al. | 437/29 |
| 4,904,614 | 2/1990 | Fisher et al. | 437/41 |
| 4,914,051 | 4/1990 | Huie et al. | 437/59 |
| 4,918,026 | 4/1990 | Kosiak et al. | 437/31 |

FOREIGN PATENT DOCUMENTS

| | | | |
|---|---|---|---|
| 0004238 | 9/1979 | European Pat. Off. | 357/53 |
| 0064365 | 3/1988 | Japan | 357/53 |

*Primary Examiner*—Brian E. Hearn
*Assistant Examiner*—T. N. Quach
*Attorney, Agent, or Firm*—Harry A. Wolin

[57] ABSTRACT

A method of fabricating a lateral semiconductor structure includes providing a semiconductor substrate and forming wells therein. Following formation of a dielectric layer on the substrate, field region openings are formed through which field regions are implanted into the substrate. The self-aligned formation of field oxidation regions to the field region openings then occurs and is followed by the formation of field plates on the field oxidation regions. A first active device region is then formed in said substrate, the formation of which is self-aligned to the field plates. This is followed by the formation of a second active device region in the first active device region which is also self-aligned to the field plates. The resulting structure allows for high speed devices that maintain consistently high current gain without sacrificing Early or breakdown voltages.

17 Claims, 2 Drawing Sheets

METHOD OF FABRICATING A LATERAL SEMICONDUCTOR STRUCTURE INCLUDING FIELD PLATES FOR SELF-ALIGNMENT

BACKGROUND OF THE INVENTION

This invention relates, in general, to semiconductor devices, and more particularly to a method of fabricating a lateral semiconductor structure.

Conventional methods of fabricating lateral semiconductor structures are somewhat deficient in that the fabricated devices must sacrifice Early and breakdown voltages in order to maintain consistently high current gain. This is especially true of a lateral PNP bipolar device. In high voltage applications, lateral bipolar transistors generally require a large base width which is extremely hard to reproduce and control. The large base width causes increased base recombination thereby increasing the base current requirements of the device. Additionally, the large base width results in a device having greatly decreased speed.

In view of the above, it would be highly desirable to have a method of fabricating a lateral semiconductor structure that would allow for a relatively high speed device that maintains consistently high current gain without sacrificing Early or breakdown voltages.

SUMMARY OF THE INVENTION

Accordingly, it is an object of the present invention to provide a method of fabricating a lateral semiconductor structure wherein the device incorporated therein may maintain consistently high current gain without sacrificing Early and breakdown voltages.

Another object of this invention is to provide a method of fabricating a lateral semiconductor structure wherein the device incorporated therein is relatively high speed.

It is an additional object of the present invention to provide a method of fabricating a lateral semiconductor structure wherein first and second active device regions may be self-aligned to field plates.

Yet a further object of the present invention is to provide a method of fabricating a lateral semiconductor structure wherein the bipolar device incorporated therein has a relatively small and uniform base width allowing for reduced base recombination.

The foregoing and other objects and advantages are achieved in the present invention by one embodiment in which, as a part thereof, includes providing a semiconductor substrate and forming wells therein. After a dielectric layer is formed on the substrate, field region openings are formed in the dielectric layer and field regions are implanted therethrough. The field region openings are further employed for the self-aligned formation of field oxidation regions on the substrate above the field regions. Following the formation of polysilicon field plates on the field oxidation regions, a first active device region being self-aligned to the field plates is formed in the substrate and a second active device region, also self-aligned to the field plates is formed in the first active device region.

A more complete understanding of the present invention can be attained by considering the following detailed description in conjunction with the accompanying drawings.

DETAILED DESCRIPTION OF THE DRAWINGS

Figure 1:
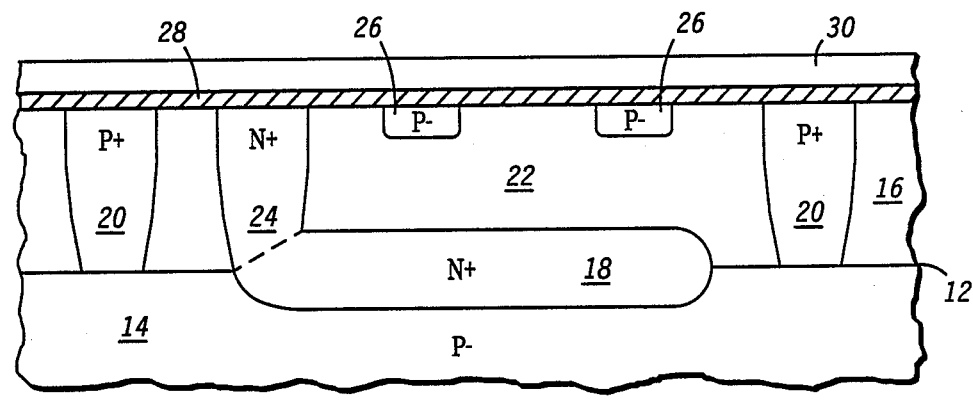
FIGS. 1 and 2 are highly enlarged cross-sectional views of a portion of a lateral semiconductor device during processing embodying the present invention.
Figure 2:
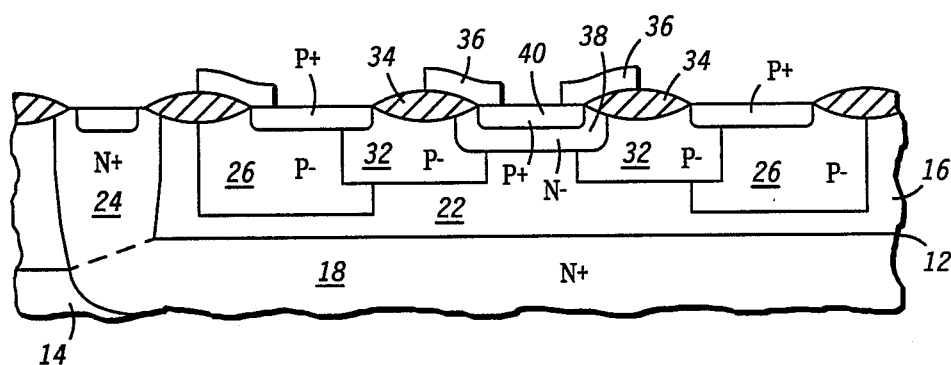

FIGS. 1 and 2 are highly enlarged cross-sectional views of a portion of a lateral semiconductor device during processing embodying the present invention. It should be understood that although a lateral PNP bipolar device is depicted in the figures, the present invention may also be employed to fabricate a lateral NPN bipolar transistor as well as MOS transistors. Accordingly, the present invention should not be limited to those embodiments disclosed herein.

As shown in FIG. 1, semiconductor structure 10 includes a substrate 12. Substrate 12 comprises a monosilicon substrate 14 having a P− conductivity type. Substrate 12 further comprises an epitaxial layer 16 disposed on substrate 14. In this embodiment, epitaxial layer 16 comprises a P− epitaxial layer disposed directly on substrate 14 and a N epitaxial layer disposed on the P−epitaxial layer. Further, an antimony N+ buried layer 18 is formed in substrate 12. Epitaxial layer 16 and buried layer 18 of substrate 12 are formed on substrate 14 by methods well known in the art.

Isolation regions 20 of a P+ conductivity type are then formed in epitaxial layer 16 of substrate 12 to isolate a device area 22. Isolation regions 20 are formed by methods well known in the art which include a photoresist mask and dopant diffusion. Following the formation of isolation regions 20, a sinker 24 having an N+ conductivity type is formed in epitaxial layer 16 of substrate 12 and extends to buried layer 18. As will be shown presently, base contact will be made through buried layer 18 and sinker 24.

Following the formation of sinker 24, wells 26 are formed in device area 22. Wells 26 are of a P− conductivity type in this embodiment and are formed by methods well known in the art. In this embodiment, a well photoresist layer and an implant oxide layer are formed on epitaxial layer 16 of substrate 12 prior to the drive assisted implant of wells 26. Following the implantation of wells 26, a blanket oxide strip is performed to remove all remaining oxides including the implant oxide layer. A substrate oxide layer 28 is then formed on epitaxial layer 16 of substrate 12 and is followed by the formation of a nitride layer 30 thereon. Once nitride layer 30 has been formed, field region openings (not shown) are formed and extend through nitride layer 30 to substrate oxide layer 28. These field region openings are formed by methods well known in the art.

Once field region openings have been formed, field regions 32 are implanted therethrough into epitaxial layer 16 of substrate 12 as shown in FIG. 2. In this embodiment, field regions 32 are of a P− conductivity type. Field regions 32 are doped in the range of $8.0 \times 10^{12}$ to $3.0 \times 10^{13}$ ions per centimeter squared with boron. This light doping enables a relatively small device to achieve high breakdown voltages. Following the implantation of field regions 32, field oxidation regions 34 are formed above field regions 32. The formation of field oxidation regions 34 is self-aligned to the field region openings. Further, field oxidation regions 34 are formed by LOCOS oxidation in this embodiment. Following the formation of field oxidation regions 34, all oxides except field oxidation regions 34 as well as nitride layer 30 are stripped from the surface of structure 10. Following this strip, sacrificial and final gate oxides (not shown) may be formed on structure 10. The formation of these oxide layers is by methods well known in the art.

Polysilicon field plates 36 are now formed on particular field oxidation regions 34. Field plates 36 extend beyond field oxidation regions 34. This serves to define the size of the active device regions whose formation will be explained presently. Field plates 36 are formed in this embodiment by forming a polysilicon layer on structure 10 followed by $PH_3$ doping and then the formation of a mask and a subsequent etch to form field plates 36 as shown. Field plates 36 serve to spread out the electric field and thereby increase the junction breakdown voltage. Further, field plates 36 prevent the surface inversion of the base in a bipolar device due to their electrical connection to the emitter. Following the formation of polysilicon field plates 36, a poly-oxide layer (not shown) is formed on the surface of semiconductor structure 10.

The formation of a first active device region 38 now occurs. In this embodiment of a lateral PNP bipolar transistor, first active device region 38 is a base region having an N− conductivity type. However, one of skill in the art will understand that if semiconductor structure 10 was to be employed as an MOS device, first active device region 38 would be a tub region. The formation of first active device region 38 is self-aligned to polysilicon field plates 36. This allows for a uniform (reproducible and controllable) base width. Further, the graded and relatively heavily doped base may be narrow (1–2 microns). This creates reduced base recombination which in turn allows for reduced base current requirements while further enabling higher current gains. It should be understood that the concentration gradient in the base creates an internal electric field which enhances the transport of minority carriers across the base. Of course, this all results in a device having increased speed.

Following the formation of first active device region 38, a second active device region 40 is formed in first active device region 38. The formation of second active device region 40 is also self-aligned to polysilicon field plates 36. In this embodiment, second active device region 40 has a P+ conductivity type and serves as the emitter region. Again, one of skill in the art will understand that if semiconductor structure 10 were to be utilized with an MOS device, second active device region 40 would be employed as a source region.

Figure 3:
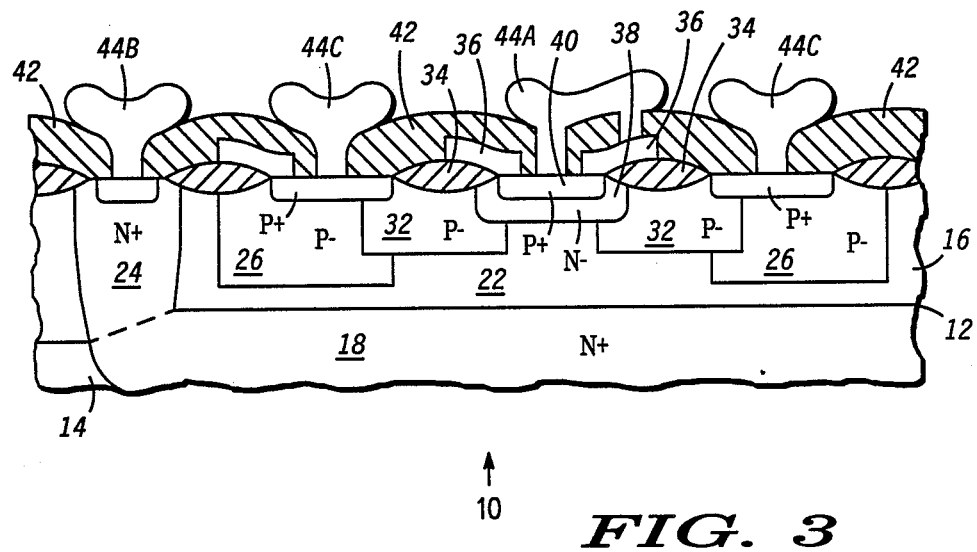
FIGS. 3 and 4 are highly enlarged cross-sectional views of portions of lateral semiconductor devices fabricated with the present invention.
Figure 4:
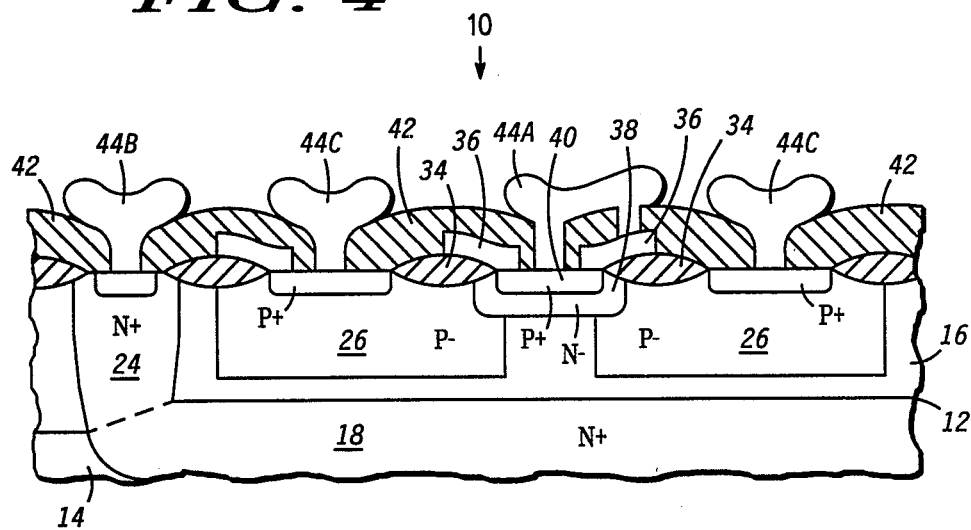

FIGS. 3 and 4 are highly enlarged cross-sectional views of portions of lateral semiconductor devices fabricated with the present invention. FIG. 3 depicts the formation of dielectric regions 42. Dielectric regions 42 comprise a low temperature oxide in this embodiment and are formed by depositing a low temperature oxide layer followed by densification and a P+ drive. A contact photoresist layer is then formed and contact openings are etched in the low temperature oxide layer. Metal contacts 44 are then formed in the contact openings. As shown, metal contact 44A is the emitter contact, metal contact 44B is the base contact and metal contacts 44C are the collector contacts. Metal contacts 44 are formed by methods well known in the art.

FIG. 4 illustrates a portion of a lateral PNP bipolar transistor also fabricated using the present invention. FIG. 4 differs from FIG. 3 in that field regions 32 are not employed and wells 26 are expanded to cover much of the area covered by wells 26 and field regions 32 in FIG. 3. The use of wells 26 in FIG. 4 as well as in FIG. 3 increases the junction depth and enables higher breakdown voltages to be achieved.

Thus it is apparent that there has been provided, in accordance with the invention, a method of fabricating a lateral semiconductor structure that will allow for devices having increased speed and that will maintain consistently high current gain without sacrificing Early or breakdown voltages. While specific embodiments of the present invention have been shown and described, further modifications and improvements will occur to those skilled in the art. It is desired that it be understood, therefore, that this invention is not limited to the particular forms shown and it is intended in the appended claims to cover all modifications which do not depart from the spirit and scope of this invention.

What is claimed is:

1. A method of fabricating a lateral semiconductor structure comprising the steps of:
   providing a substrate;
   forming wells in said substrate;
   forming field oxidation regions on said substrate above said wells;
   forming field plates at least partially on said field oxidation regions;
   forming a first active device region in said substrate, said first active device region being of a first conductivity type and its formation being self-aligned to said field plates; and
   forming a second active device region in said first active device region, said second active device region being of a second conductivity type and its formation also being self-aligned to said field plates.

2. The method of claim 1 wherein the forming field oxidation regions step includes forming LOCOS field oxidation regions.

3. The method of claim 2 wherein the forming field plates step includes forming polysilicon field plates.

4. The method of claim 3 wherein the semiconductor structure is employed for a bipolar device, the first active device region being a base region and the second active device region being an emitter region.

5. The method of claim 3 wherein the semiconductor structure is employed for an MOS device, the first active device region being a tub region and the second active device region being a source region.

6. A method of fabricating a lateral semiconductor structure comprising the steps of:
   providing a semiconductor substrate;
   forming wells in said substrate;
   forming a dielectric layer on said substrate;
   forming field region openings in said dielectric layer;
   forming field regions in said substrate through said field region openings;
   forming field oxidation regions on said substrate above said field regions, the formation of said field oxidation regions being self-aligned to said field region openings;
   forming field plates at least partially on said field oxidation regions;

forming a first active device region in said substrate, the formation of which is self-aligned to said field plates; and forming a second active device region in said first active device region, the formation of which is also self-aligned to said field plates.

7. The method of claim 6 wherein the forming field oxidation regions step includes forming LOCOS field oxidation regions.

8. The method of claim 6 wherein the forming field plates step includes forming polysilicon field plates.

9. The method of claim 6 wherein the semiconductor structure is employed for a bipolar device, the first active device region being a base region and the second active device region being an emitter region.

10. The method of claim 6 wherein the semiconductor structure is employed for an MOS device, the first active device region being a tub region and the second active device region being a source region.

11. A method of fabricating a lateral semiconductor structure comprising the steps of:

providing a semiconductor substrate having a buried layer therein;

isolating a device area in said substrate;

forming a sinker in said device area, said sinker extending to said buried layer;

forming wells in said device area;

forming a first dielectric layer on said substrate;

forming field region openings in said first dielectric layer;

forming field regions in said device area through said field region openings;

forming field oxidation regions on said device area above said field regions, the formation of said field oxidation regions being self-aligned to said field region openings;

forming polysilicon field plates at least partially on said field oxidation regions;

forming a first active device region in said device area, the formation of which is self-aligned to said field plates;

forming a second active device region in said first active device region, the formation of which is also self-aligned to said field plates;

forming a second dielectric layer on said structure; and forming contacts to the active device regions.

12. The method of claim 11 wherein the forming field oxidation regions step includes forming LOCOS field oxidation regions.

13. The method of claim 12 further including the step of forming a gate oxide layer between the field oxidation regions and the polysilicon field plates.

14. The method of claim 12 wherein the forming a first dielectric layer step includes forming a substrate oxide layer on the substrate and forming a nitride layer on said substrate oxide layer.

15. The method of claim 14 wherein the forming a second dielectric layer step includes forming a low temperature oxide layer.

16. The method of claim 15 wherein the semiconductor structure is employed for a bipolar device, the first active device region being a base region and the second active device region being and emitter region.

17. The method of claim 15 wherein the semiconductor structure is employed for an MOS device, the first active device region being a tub region and the second active device region being a source region.

* * * * *